US012700846B2

(12) United States Patent
Dyer et al.

(10) Patent No.: US 12,700,846 B2
(45) **Date of Patent: *Aug. 4, 2026**

(54) TRANSVERSELY-EXCITED FILM BULK ACOUSTIC RESONATORS WITH INTERDIGITAL TRANSDUCER CONFIGURED TO REDUCE DIAPHRAGM STRESS

(71) Applicant: Murata Manufacturing Co., Ltd., Nagaokakyo (JP)

(72) Inventors: Greg Dyer, Santa Barbara, CA (US); Bryant Garcia, Mississauga (CA); Doug Jachowski, Santa Cruz, CA (US); Robert Hammond, Rockville, MD (US); Neal Fenzi, Santa Barbara, CA (US); Ryo Wakabayashi, Santa Clara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 218 days.

This patent is subject to a terminal disclaimer.

(21) Appl. No.: 18/412,131

(22) Filed: Jan. 12, 2024

(65) Prior Publication Data

US 2024/0154597 A1     May 9, 2024

Related U.S. Application Data

(63) Continuation of application No. 17/901,743, filed on Sep. 1, 2022, now Pat. No. 11,909,374, which is a (Continued)

(51) Int. Cl.
*H03H 9/02* (2006.01)
*H03H 9/17* (2006.01)
(Continued)

(52) U.S. Cl.
CPC .... *H03H 9/02228* (2013.01); *H03H 9/02015* (2013.01); *H03H 9/02133* (2013.01); (Continued)

(58) Field of Classification Search
CPC ........... H03H 9/02228; H03H 9/02015; H03H 9/02133; H03H 9/174; H03H 9/205; H03H 9/54; H03H 9/02062; H03H 9/13 (Continued)

(56) References Cited

U.S. PATENT DOCUMENTS 5,705,399 A     1/1998 Larue
5,853,601 A     12/1998 Krishaswamy et al.
(Continued)

FOREIGN PATENT DOCUMENTS

CN         1926763 A      3/2007
CN        201893487 U     7/2011
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Jorge L Salazar, Jr.
(74) *Attorney, Agent, or Firm* — ArentFox Schiff LLP

(57) ABSTRACT

An acoustic resonator is provided that includes a substrate; a piezoelectric layer having a portion that forms a diaphragm over a cavity; and IDT on the piezoelectric layer that includes a first conductor level including first and second busbars disposed on respective portions of the piezoelectric layer, a first set of elongated fingers extending from the first bus bar onto the diaphragm, and a second set of elongated fingers extending from the second bus bar onto the diaphragm, the second set of elongated fingers interleaved with (Continued)

the first set of elongated fingers. The acoustic resonator also includes a second conductor level over the piezoelectric layer and covering at least portions of the first and second busbars.

18 Claims, 8 Drawing Sheets

Related U.S. Application Data continuation of application No. 17/109,011, filed on Dec. 1, 2020, now Pat. No. 11,469,733.

(60) Provisional application No. 63/021,036, filed on May 6, 2020.

(51) Int. Cl.
*H03H 9/205* (2006.01)
*H03H 9/54* (2006.01)

(52) U.S. Cl.
CPC ............ *H03H 9/174* (2013.01); *H03H 9/205* (2013.01); *H03H 9/54* (2013.01)

(58) Field of Classification Search
USPC ................................................ 333/193–196
See application file for complete search history.

(56) References Cited

U.S. PATENT DOCUMENTS

| | | | |
|---|---|---|---|
| 6,540,827 B1 | 4/2003 | Levy et al. | |
| 6,707,229 B1 | 3/2004 | Martin | |
| 7,135,940 B2 | 11/2006 | Kawakubo et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,802,466 B2 | 9/2010 | Whalen et al. | |
| 7,868,519 B2 | 1/2011 | Umeda | |
| 8,278,802 B1 | 10/2012 | Lee et al. | |
| 8,344,815 B2 | 1/2013 | Yamanaka | |
| 8,829,766 B2 | 9/2014 | Milyutin et al. | |
| 8,932,686 B2 | 1/2015 | Hayakawa et al. | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,748,923 B2 | 8/2017 | Kando et al. | |
| 9,780,759 B2 | 10/2017 | Kimura et al. | |
| 10,200,013 B2 | 2/2019 | Bower et al. | |
| 10,305,447 B2 | 5/2019 | Raihn et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,826,462 B2 | 11/2020 | Plesski et al. | |
| 10,868,513 B2 | 12/2020 | Yantchev | |
| 11,469,733 B2 * | 10/2022 | Dyer .................. | H03H 9/02015 |
| 11,909,374 B2 * | 2/2024 | Dyer ........................ | H03H 9/54 |
| 2002/0079986 A1 | 6/2002 | Ruby et al. | |
| 2002/0153970 A1 * | 10/2002 | Noto .................. | H03H 9/02559 |
| | | | 333/195 |
| 2002/0158714 A1 | 10/2002 | Kaitila et al. | |
| 2003/0199105 A1 | 10/2003 | Kub et al. | |
| 2004/0041496 A1 | 3/2004 | Imai et al. | |
| 2004/0090145 A1 | 5/2004 | Bauer et al. | |
| 2004/0207033 A1 | 10/2004 | Koshido | |
| 2004/0207485 A1 | 10/2004 | Kawachi et al. | |
| 2004/0261250 A1 | 12/2004 | Kadota et al. | |
| 2005/0280476 A1 | 12/2005 | Abe et al. | |

| | | | |
|---|---|---|---|
| 2006/0072875 A1 | 4/2006 | Bhagavatula et al. | |
| 2006/0125489 A1 | 6/2006 | Feucht et al. | |
| 2006/0131731 A1 | 6/2006 | Sato | |
| 2006/0152107 A1 | 7/2006 | Tanaka | |
| 2006/0222568 A1 | 10/2006 | Wang et al. | |
| 2007/0001549 A1 | 1/2007 | Kando et al. | |
| 2007/0090898 A1 | 4/2007 | Kando | |
| 2007/0170565 A1 | 7/2007 | Hong et al. | |
| 2007/0188047 A1 | 8/2007 | Tanaka | |
| 2007/0194863 A1 | 8/2007 | Shibata et al. | |
| 2010/0064492 A1 | 3/2010 | Tanaka | |
| 2010/0102669 A1 | 4/2010 | Yamanaka | |
| 2010/0107388 A1 | 5/2010 | Iwamoto | |
| 2010/0123367 A1 | 5/2010 | Tai et al. | |
| 2010/0212127 A1 | 8/2010 | Heinze et al. | |
| 2010/0223999 A1 | 9/2010 | Onoe | |
| 2010/0301703 A1 | 12/2010 | Chen et al. | |
| 2011/0109196 A1 | 5/2011 | Goto | |
| 2011/0199163 A1 | 8/2011 | Yamanaka | |
| 2011/0278993 A1 | 11/2011 | Iwamoto | |
| 2013/0015353 A1 | 1/2013 | Tai et al. | |
| 2013/0021116 A1 | 1/2013 | Sogoya et al. | |
| 2013/0057360 A1 | 3/2013 | Meltaus et al. | |
| 2013/0234805 A1 * | 9/2013 | Takahashi .............. | H10N 30/87 |
| | | | 29/25.35 |
| 2013/0321100 A1 | 12/2013 | Wang | |
| 2014/0001919 A1 | 1/2014 | Komatsu | |
| 2014/0009032 A1 | 1/2014 | Takahashi et al. | |
| 2014/0113571 A1 | 4/2014 | Fujiwara | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0218129 A1 | 8/2014 | Fujiwara | |
| 2014/0225684 A1 | 8/2014 | Kando et al. | |
| 2014/0312994 A1 | 10/2014 | Meltaus et al. | |
| 2015/0070227 A1 | 3/2015 | Kishino et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0049920 A1 | 2/2016 | Kishino | |
| 2016/0182009 A1 | 6/2016 | Bhattacharjee | |
| 2016/0285430 A1 | 9/2016 | Kikuchi et al. | |
| 2017/0005638 A1 | 1/2017 | Otagawa et al. | |
| 2017/0063332 A1 | 3/2017 | Gilbert et al. | |
| 2017/0077902 A1 | 3/2017 | Daimon | |
| 2017/0104470 A1 | 4/2017 | Koelle et al. | |
| 2017/0170808 A1 | 6/2017 | Iwaki et al. | |
| 2017/0179928 A1 | 6/2017 | Raihn et al. | |
| 2017/0187352 A1 | 6/2017 | Omura | |
| 2017/0214387 A1 | 7/2017 | Burak et al. | |
| 2017/0222618 A1 | 8/2017 | Inoue et al. | |
| 2017/0222622 A1 | 8/2017 | Solal et al. | |
| 2017/0264263 A1 | 9/2017 | Huang et al. | |
| 2017/0324394 A1 | 11/2017 | Ebner et al. | |
| 2017/0359050 A1 | 12/2017 | Irieda et al. | |
| 2017/0370791 A1 | 12/2017 | Nakamura et al. | |
| 2018/0062604 A1 | 3/2018 | Koskela et al. | |
| 2018/0123016 A1 | 5/2018 | Gong et al. | |
| 2018/0152169 A1 | 5/2018 | Goto et al. | |
| 2018/0191322 A1 | 7/2018 | Chang et al. | |
| 2018/0212581 A1 * | 7/2018 | Matsumoto ........ | H03H 9/02535 |
| 2019/0068164 A1 | 2/2019 | Houlden et al. | |
| 2019/0123721 A1 | 4/2019 | Takamine | |
| 2019/0131953 A1 | 5/2019 | Gong | |
| 2019/0148621 A1 | 5/2019 | Feldman et al. | |
| 2019/0181833 A1 | 6/2019 | Nosaka | |
| 2019/0245518 A1 | 8/2019 | Ito | |
| 2019/0273480 A1 | 9/2019 | Lin | |
| 2019/0273481 A1 | 9/2019 | Michigami | |
| 2019/0386635 A1 | 12/2019 | Plesski et al. | |
| 2019/0386637 A1 | 12/2019 | Plesski et al. | |
| 2019/0386638 A1 | 12/2019 | Kimura et al. | |
| 2020/0007110 A1 | 1/2020 | Konaka et al. | |
| 2020/0021271 A1 | 1/2020 | Plesski et al. | |
| 2020/0091893 A1 | 3/2020 | Plesski et al. | |
| 2020/0162052 A1 | 5/2020 | Matsuoka et al. | |
| 2020/0220522 A1 | 7/2020 | Nosaka | |
| 2020/0228087 A1 | 7/2020 | Michigami et al. | |

(56)        References Cited

U.S. PATENT DOCUMENTS

| | | |
|---|---|---|
| 2020/0304091 A1 | 9/2020 | Yantchev |
| 2020/0328728 A1 | 10/2020 | Nakagawa et al. |
| 2020/0336130 A1 | 10/2020 | Turner |
| 2020/0373907 A1 | 11/2020 | Garcia |
| 2021/0006228 A1 | 1/2021 | Garcia |
| 2021/0013859 A1 | 1/2021 | Turner et al. |
| 2021/0013868 A1 | 1/2021 | Plesski |
| 2021/0126619 A1 | 4/2021 | Wang et al. |
| 2021/0273631 A1 | 9/2021 | Jachowski et al. |
| 2021/0384885 A1 | 12/2021 | Daimon et al. |
| 2022/0103160 A1 | 3/2022 | Jachowski |
| 2022/0216842 A1 | 7/2022 | Nagatomo et al. |
| 2022/0231661 A1 | 7/2022 | McHugh |

FOREIGN PATENT DOCUMENTS

| | | |
|---|---|---|
| CN | 112352382 A | 2/2021 |
| DE | 112011100580 T5 | 1/2013 |
| JP | H0522074 A | 1/1993 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010103803 A | 5/2010 |
| JP | 2010109949 A | 5/2010 |
| JP | 2010233210 A | 10/2010 |
| JP | 2013528996 A | 7/2013 |
| JP | 2015054986 A | 3/2015 |
| JP | 2016001923 A | 1/2016 |
| JP | 2017220910 A | 12/2017 |
| JP | 2018166259 A | 10/2018 |
| JP | 2018207144 A | 12/2018 |
| JP | 2019186655 A | 10/2019 |
| JP | 2020088459 A | 6/2020 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2015156232 A1 | 10/2015 |
| WO | 2015182521 A1 | 12/2015 |
| WO | 2016017104 A1 | 2/2016 |
| WO | 2016052129 A1 | 4/2016 |
| WO | 2016147687 A1 | 9/2016 |
| WO | 2018003273 A1 | 1/2018 |
| WO | 2018079522 A1 | 5/2018 |
| WO | 2018163860 A1 | 9/2018 |
| WO | 2019138810 A1 | 7/2019 |
| WO | 2019241174 A1 | 12/2019 |
| WO | 2020092414 A2 | 5/2020 |
| WO | 2020175234 A1 | 9/2020 |
| WO | 2021060523 A1 | 4/2021 |
| WO | 2023002858 A1 | 1/2023 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM OF 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, @ 2018 Tibtech Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi:10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

USPTO/ISA, International Search Report and Written Opinion for PCT Application No. PCT/US2023/017732 dated Jul. 27, 2023.

USPTO/ISA, International Search Report and Written Opinion for PCT Application No. PCT/US2022/082421 dated May 3, 2023.

USPTO/ISA, International Search Report and Written Opinion for PCT Application No. PCT/US2022/081095 dated May 30, 2023.

USPTO/ISA, International Search Report and Written Opinion for PCT Application No. PCT/US2022/079236 dated Mar. 10, 2023.

USPTO/ISA, International Search Report and Written Opinion for PCT Application No. PCT/US2022/081068 dated Apr. 18, 2023.

USPTO/ISA, International Search Report and Written Opinion for PCT Application No. PCT/US2022/080246 dated Mar. 30, 2023.

Gong et al., "Design and Analysis of Lithium-Niobate-Based High Electromechanical Coupling RF-MEMS Resonators for Wideband Filtering", IEEE Transactions on Microwave Theory and Techniques, vol. 61, No. 1, Jan. 2013, pp. 403-413.

* cited by examiner

DETAIL C

DETAIL D

SECTION A-A

800

805

Start

Form cavities in substrate 810A

Form back-side dielectric 815

Bond piezoelectric plate to substrate 820

Form conductor patterns 830

Form front-side dielectric layer(s) 840

Back-side etch cavities in substrate 810B

Front-side etch cavities in substrate 810C

Complete device 860

End

895

Note: only one of actions 810A, 810B, 810C is performed in each of three variations of the process 800.

TRANSVERSELY-EXCITED FILM BULK ACOUSTIC RESONATORS WITH INTERDIGITAL TRANSDUCER CONFIGURED TO REDUCE DIAPHRAGM STRESS

CROSS REFERENCE TO RELATED APPLICATIONS

This patent is a continuation application of co-pending U.S. patent application Ser. No. 17/901,743, filed Sep. 1, 2022, which is a continuation of U.S. patent application Ser. No. 17/109,011, filed Dec. 1, 2020, now issued as U.S. Pat. No. 11,469,733, which claims priority from U.S. Provisional Patent Application No. 63/021,036, filed May 6, 2020, the entire contents of each of which are incorporated herein by reference.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 uses the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
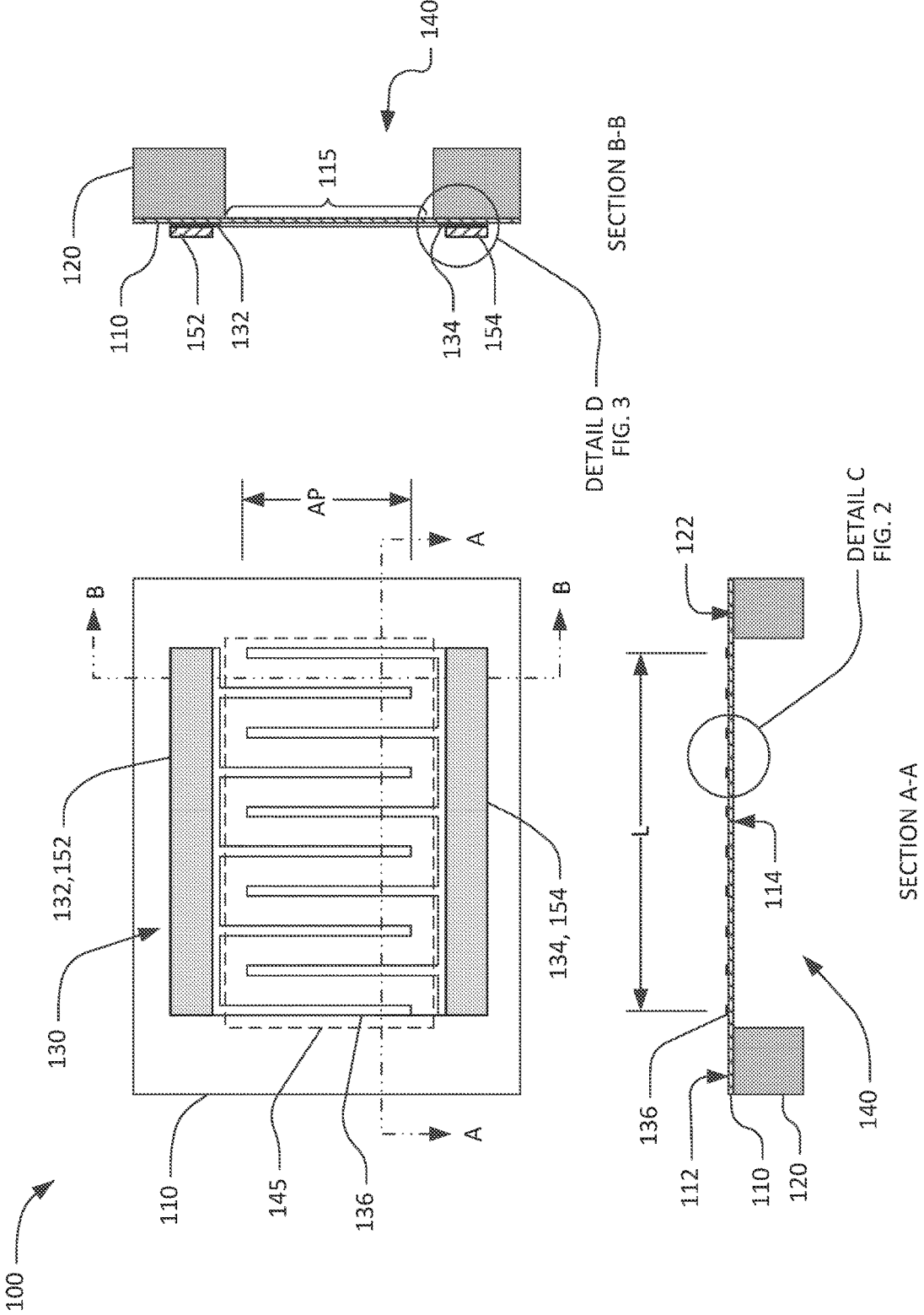
FIG. 1 is a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

The XBAR 100 includes a piezoelectric plate 110 having a front surface 112 and a back surface 114. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are rotated YX-cut. However, XBARs may be fabricated on piezoelectric plates with other crystallographic orientations including Z-cut, rotated Z-cut, and rotated Y-cut.

The back surface 114 of the piezoelectric plate 110 is attached to a surface 122 of a substrate 120 except for a portion of the piezoelectric plate 110 that forms a diaphragm 115 spanning a cavity 140 formed in the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or otherwise attached to the substrate. The piezoelectric plate 110 may be attached directly to the substrate 120 or may be attached to the substrate 120 via one or more intermediate material layers (not shown).

The cavity 140 is an empty space within a solid body of the resonator 100. The cavity 140 may be a hole completely through the substrate 120 (as shown in Section A-A and Section B-B) or a recess in the substrate 120 (as shown subsequently in FIG. 3). The cavity 140 may be formed, for example, by selective etching of the substrate 120 before or after the piezoelectric plate 110 and the substrate 120 are attached.

Two or more conductor levels are formed on the front surface 112 of the piezoelectric plate. The two or more conductor levels are patterned using different photomasks such that the two or more conductor levels are not identical. Each conductor level is formed of one or more thin metal layers. The first conductor level includes an interdigital transducer (IDT) 130. An IDT is an electrode structure for converting between electrical and acoustic energy in piezoelectric devices. The IDT 130 includes a first plurality of parallel elongated conductors, commonly called "fingers", such as finger 136, extending from a first level of a first busbar 132. The IDT 130 includes a second plurality of fingers extending from a first level of a second busbar 134. The first and second pluralities of parallel fingers are interleaved. The interleaved IDT fingers overlap for a distance AP, commonly referred to as the "aperture" of the IDT. The center-to-center distance L between the outermost fingers of the IDT 130 is the "length" of the IDT.

The term "busbar" refers to the conductors that interconnect the first and second sets of fingers in an IDT. As shown in FIG. 1, each first busbar level 132, 134 is an elongated rectangular conductor with a long axis orthogonal to the interleaved IDT fingers and having a length approximately equal to the length L of the IDT. The busbars of an IDT need not be rectangular or orthogonal to the interleaved fingers and may have lengths longer than the length of the IDT.

The first conductor level includes the interleaved fingers of the IDT and the first level of the busbars 132, 134. In a filter, the first conductor level may also be a first level of other conductors interconnecting multiple XBARs in a filter circuit.

A second conductor level may include second busbar levels 152, 154 formed over all or portions of the first busbar levels 132, 134, respectively. The second conductor level is typically thicker than the first conductor level. The second conductor level improves the electrical and thermal conductivity of the busbars and other conductors. In a filter, the second conductor level may also form a second level of other conductors interconnecting multiple XBARs in a filter circuit.

The first and second busbars 132/152, 134/154 serve as the terminals of the XBAR 100. A radio frequency or microwave signal applied to the IDT, which is to say applied between the first and second busbars 132/152, 134/154, excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that the fingers, such as finger 136, of the IDT 130 are disposed on the diaphragm 115 of the piezoelectric plate that spans, or is suspended over, the cavity 140. The first and second busbars 132/152, 134/154 are not on the diaphragm. Placing the first and second busbars 132/152, 134/154 off the diaphragm reduces stress in the diaphragm. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. An XBAR for a 5G device will have an IDT with more than ten parallel fingers. An XBAR may have hundreds, possibly thousands, of parallel fingers in the IDT. Similarly, the thickness of all elements is greatly exaggerated in the in the cross-sectional views.

Figure 2:
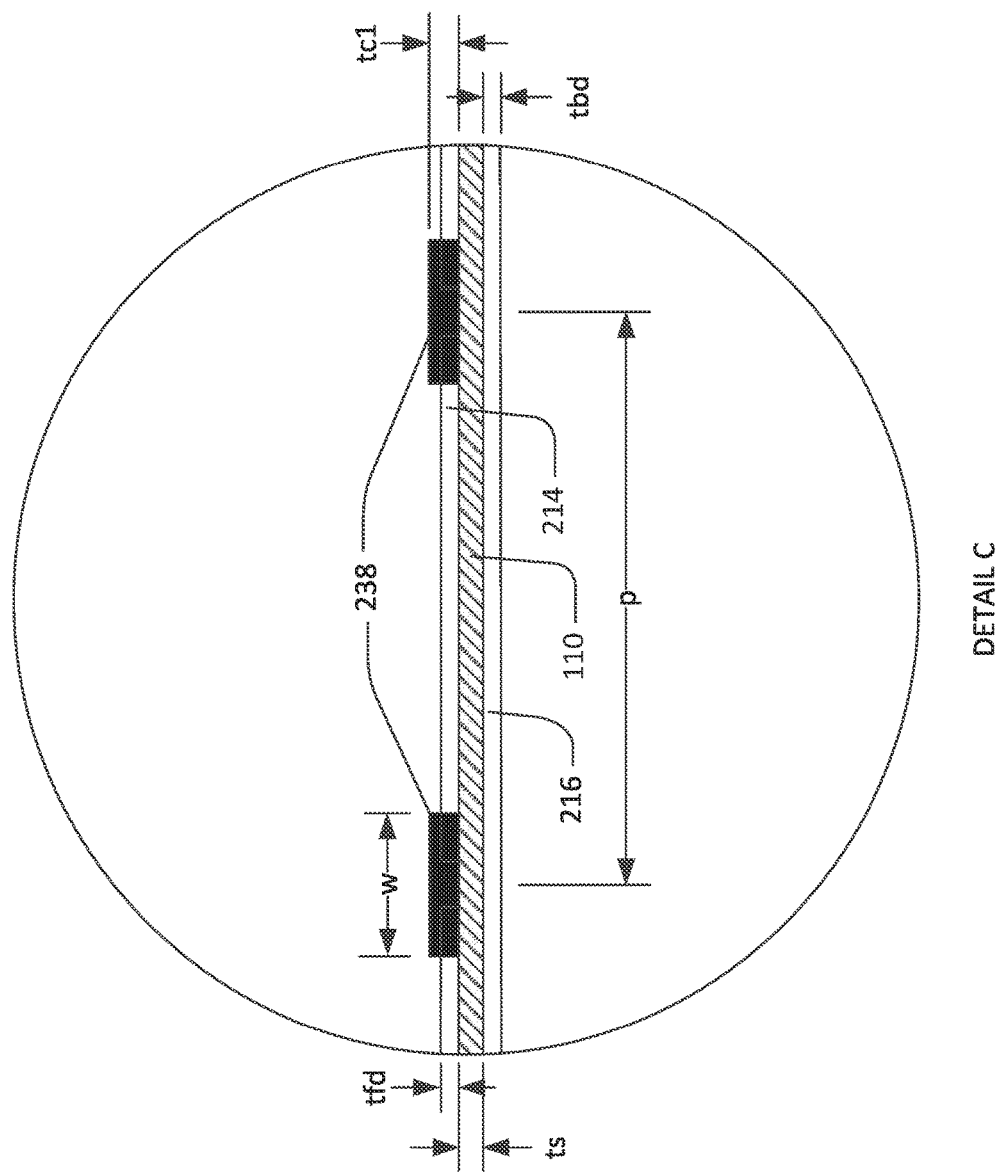
FIG. 2 is an expanded schematic cross-sectional view of a portion of the XBAR of FIG. 1.

FIG. 2 shows a detailed schematic cross-sectional view of the XBAR 100. The portion of the XBAR 100 shown in FIG. 2 is identified in FIG. 1 as "DETAIL C". The piezoelectric plate 110 is a single-crystal layer of piezoelectrical material having a thickness ts. ts may be, for example, 100 nm to 1500 nm. When used in filters for bands from 3.4 GHZ to 6 GHz (e.g. bands n77, n79, 5 GHz Wi-Fi™, 6 GHz Wi-Fi™), the thickness ts may be, for example, 200 nm to 1000 nm.

A front-side dielectric layer 214 may be formed on the front side of the piezoelectric plate 110. The "front side" of the XBAR is the surface facing away from the substrate. The front-side dielectric layer 214 has a thickness tfd. The front-side dielectric layer 214 is formed between the IDT fingers 238. Although not shown in FIG. 2, the front-side dielectric layer 214 may also be deposited over the IDT fingers 238. A back-side dielectric layer 216 may be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 are portions of the first conductor level. The first conductor level may be one or more layers of aluminum, a substantially aluminum alloy, copper, a substantially copper alloy, chromium, platinum, beryllium, gold, molybdenum, tungsten, or some other conductive material. Thin (relative to the total thickness of the conductors) layers of metals such as chromium or titanium may be formed under and/or over the fingers to improve adhesion between the fingers and the piezoelectric plate 110 and/or to passivate or encapsulate the fingers. The second conductor level on the busbars (152, 154 in FIG. 1) of the IDT may be made of the same or different materials as the fingers. As shown in FIG. 2, the IDT fingers 238 have rectangular cross-sections. The IDT fingers may have some other cross-sectional shape.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 110. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tc1 of the IDT fingers may be from 100 nm to about equal to the width w. The thickness of the second conductor level on the busbars (152, 154 in FIG. 1) of the IDT may be the same as, or greater than, the thickness tm of the IDT fingers.

Figure 3:
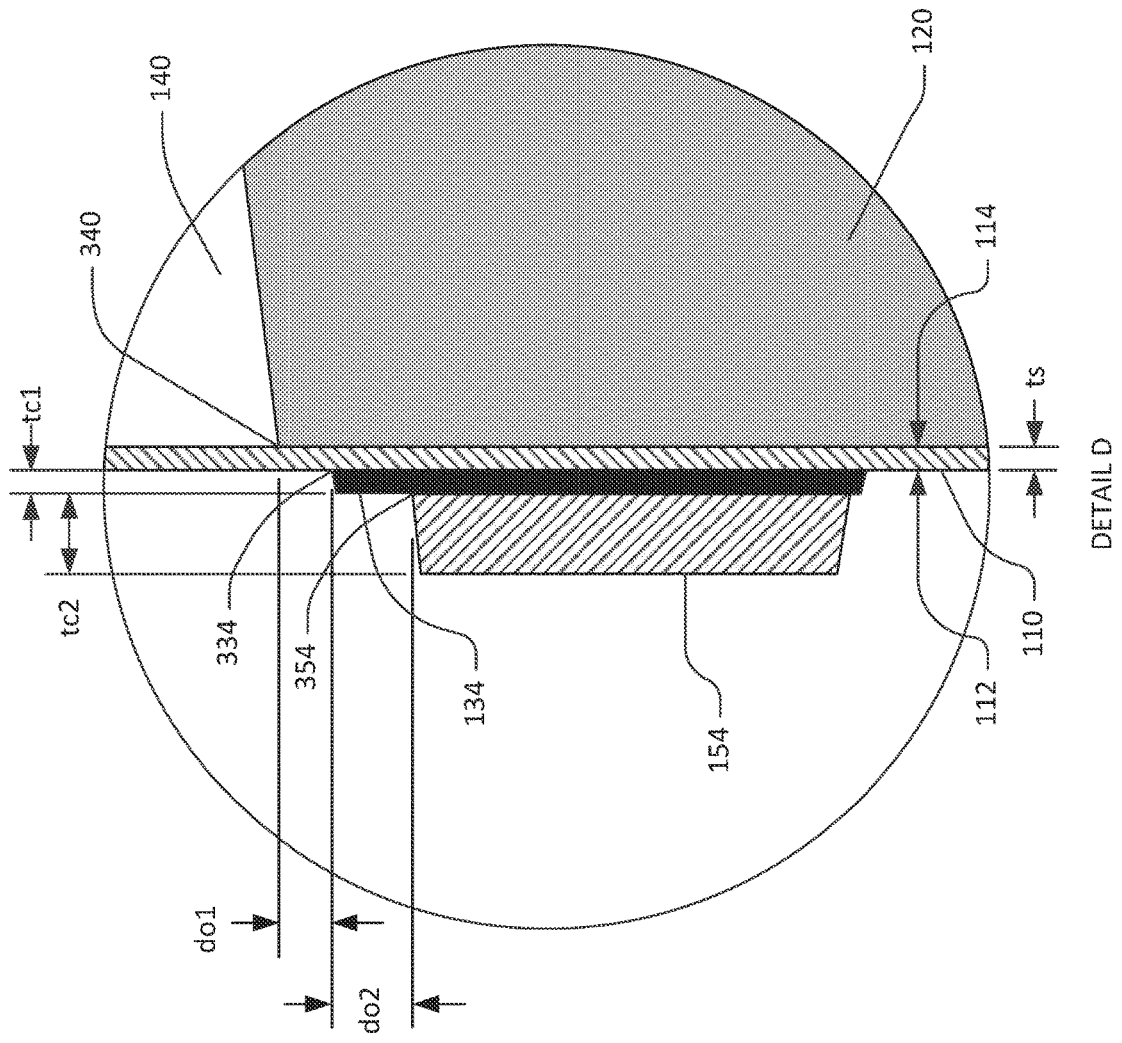
FIG. 3 is an expanded schematic cross-sectional view of another portion of the XBAR of FIG. 1.

FIG. 3 shows another detailed schematic cross-sectional view of the XBAR 100. The portion of the XBAR 100 shown in FIG. 3 is identified in FIG. 1 as "DETAIL D". The piezoelectric plate 110 is attached to and supported by the substrate 120. A portion of the piezoelectric plate forms a diaphragm extending over the cavity 140 in the substrate 120. A first busbar level 134 is a portion of a first conductor level having thickness tc1. A second busbar level 154 is a portion of a second conductor level having thickness tc2. tc2 is typically greater than tc1. The edges of the first and second conductor levels and the side of the cavity 140 are not necessarily perpendicular to the surfaces of the piezoelectric plate, as shown in FIG. 3.

An intersection of the first busbar level 134 and the front surface 112 of the piezoelectric plate 110 defines a first busbar edge 334 proximate the cavity 140. An intersection of the cavity 140 and the back surface 114 of the piezoelectric plate 110 defines a cavity edge 340 proximate the first busbar. The first busbar edge 334 is offset from the proximate cavity edge 340 by a distance do1 in a direction parallel to the surfaces of the piezoelectric plate 110. do1 is greater than or equal to zero. The distance do1 may be as small as allowed by expected manufacturing tolerances. For example, the nominal value of do1 may be set to the worst-case expected misregistration between the cavity 140 and the photomask used to pattern the first conductor level to ensure that, even with the worst-case misregistration, do1 will be greater than or equal to zero. A second busbar edge proximate the cavity and a cavity edge proximate the second busbar may be similarly defined.

The second busbar level 154 may cover a portion or substantially all of the first busbar level 134. In this context, the phrase "substantially all" means as close to all as allowed by expected manufacturing tolerances. For example, a nominal offset do2 between any edge of the second busbar level 154 and a proximate edge of the first busbar level 134 may be set to the worst-case expected misregistration between the photomasks used to pattern the first and second conductor levels.

Figure 4:
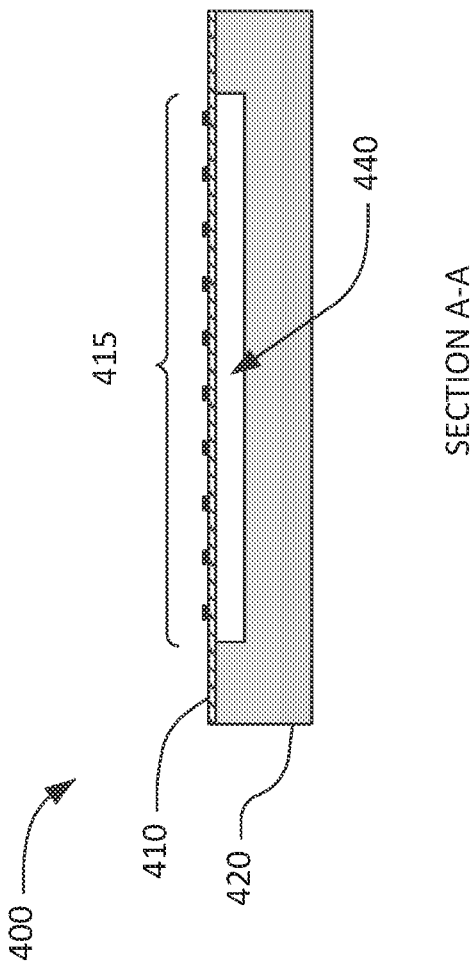
FIG. 4 is an alternative schematic cross-sectional view of the XBAR of FIG. 1.

FIG. 4 is an alternative cross-sectional view along the section plane A-A defined in FIG. 1. In FIG. 4, a piezoelectric plate 410 is attached to a substrate 420. A portion of the piezoelectric plate 410 forms a diaphragm 415 spanning a cavity 440 in the substrate. The cavity 440 does not fully penetrate the substrate 420. Fingers of an IDT are disposed on the diaphragm 415. The cavity 440 may be formed, for example, by etching the substrate 420 before attaching the piezoelectric plate 410. Alternatively, the cavity 440 may be formed by etching the substrate 420 with a selective etchant that reaches the substrate through one or more openings (not shown) provided in the piezoelectric plate 410. In this case, the diaphragm 415 may be contiguous with the rest of the piezoelectric plate 410 around a large portion of a perimeter of the cavity 440. For example, the diaphragm 415 may be contiguous with the rest of the piezoelectric plate 410 around at least 50% of the perimeter of the cavity 440.

Figure 5:
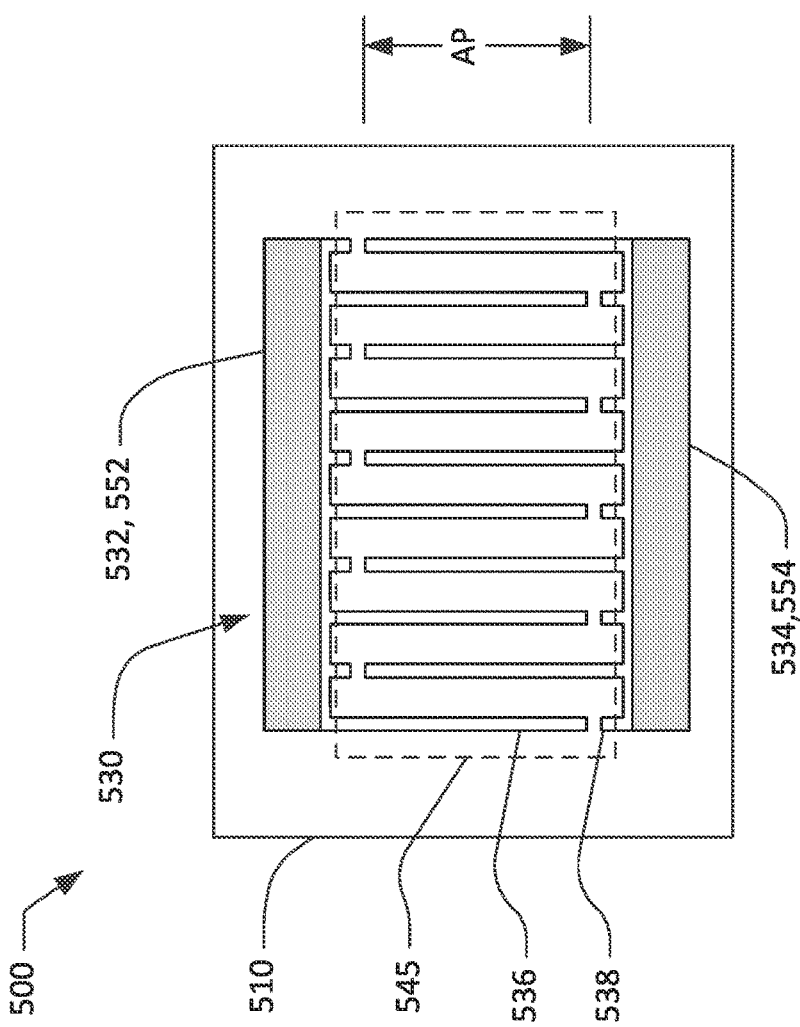
FIG. 5 is a schematic plan view of another XBAR.

FIG. 5 is a plan view of another XBAR 500. The XBAR 500 includes a piezoelectric plate 510 attached to a substrate that is not visible. A portion of the piezoelectric plate 510 forms a diaphragm spanning a cavity in the substrate. The dashed line 545 is a perimeter of the cavity defined by the intersection of the cavity and the back surface (i.e. the surface facing away from the viewer) of the piezoelectric plate 510. The portion of the piezoelectric plate 510 within the dashed rectangle 545 is the diaphragm.

An IDT 530 is formed on a front surface (i.e. the surface facing the viewer) of the piezoelectric plate. The IDT 530 includes a first plurality of parallel elongated conductors, commonly called "fingers", such as finger 536, extending from a first busbar 532. The IDT 530 includes a second plurality of fingers extending from a second busbar 534. The first and second pluralities of parallel fingers are interleaved. The interleaved IDT fingers overlap for a distance AP, commonly referred to as the "aperture" of the IDT. The first and second busbars 532, 534 are not on the diaphragm. The interleaved fingers extend from their respective busbars onto the diaphragm such that the entire aperture of the IDT is on the diaphragm. The IDT 530 also includes dummy fingers, such as dummy finger 538, that extend from the busbars onto the diaphragm. The term "dummy fingers" is commonly used to denote short fingers extending from the busbars of an IDT between the longer interleaved fingers. The presence of dummy fingers, such as dummy finger 538, extending from the busbars 532, 534 onto the diaphragm may help with removing heat from the diaphragm.

The interleaved fingers, the dummy fingers, and the busbars 532, 534 of the IDT 530 are formed from a first level conductor level. A second conductor level 552, 554 may overlap all or portions of the first and second busbars 532, 534, respectively.

Figure 6:
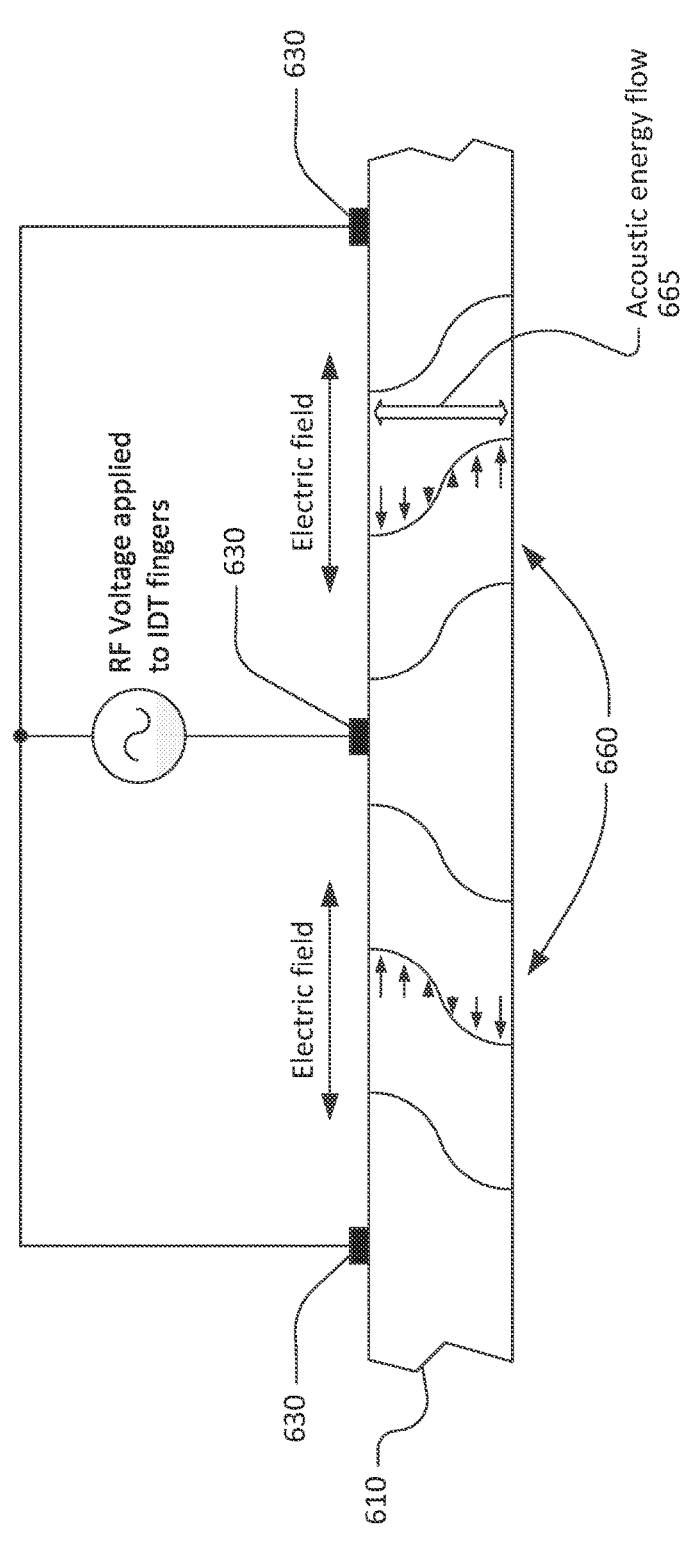
FIG. 6 is a graphic illustrating a shear primary acoustic mode in an XBAR.

FIG. 6 is a graphical illustration of the primary acoustic mode of interest in an XBAR. FIG. 6 shows a small portion of an XBAR 600 including a piezoelectric plate 610 and three interleaved IDT fingers 630. A radio frequency (RF) voltage is applied to the interleaved fingers 630. This voltage creates a time-varying electric field between the fingers. The direction of the electric field is primarily lateral, or parallel to the surface of the piezoelectric plate 610, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 610. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 600 are represented by the curves 660, with the adjacent small arrows providing a schematic indication of the direction and magnitude of atomic motion. The degree of atomic motion, as well as the thickness of the piezoelectric plate 610, have been greatly exaggerated for ease of visualization. While the atomic motions are predominantly lateral (i.e. horizontal as shown in FIG. 6), the direction of acoustic energy flow of the excited primary shear acoustic mode is substantially orthogonal to the surface of the piezoelectric plate, as indicated by the arrow 665.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 7:
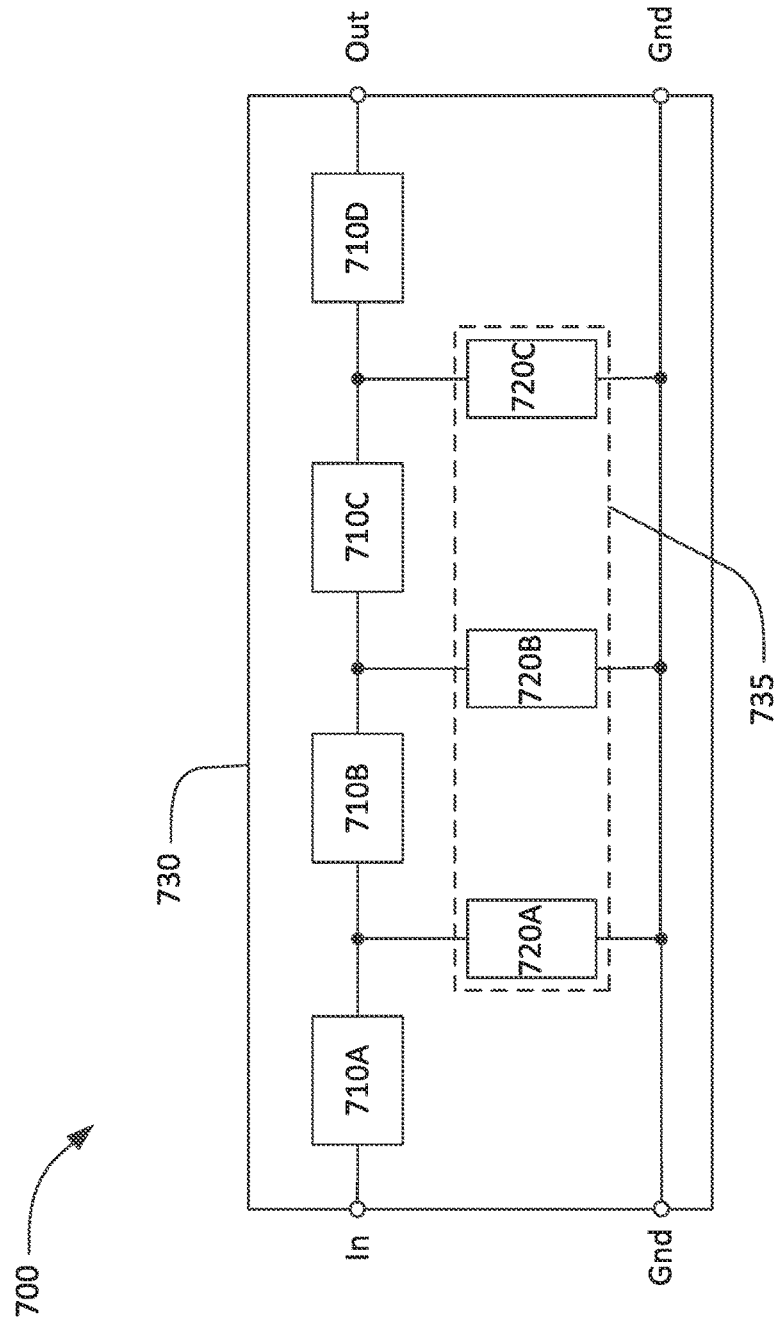
FIG. 7 is a schematic block diagram of a filter using XBARs.

FIG. 7 is a schematic circuit diagram and layout for a high frequency band-pass filter 700 using XBARs. The filter 700 has a conventional ladder filter architecture including four series resonators 710A, 710B, 710C, 710D and three shunt resonators 720A, 720B, 720C. The series resonators 710A, 710B, 710C, and 710D are connected in series between a first port and a second port (hence the term "series resonator"). In FIG. 7, the first and second ports are labeled "In" and "Out", respectively. However, the filter 700 is bidirectional and either port may serve as the input or output of the filter. The shunt resonators 720A, 720B, 720C are connected from nodes between the series resonators to ground. A filter may contain additional reactive components, such as inductors, not shown in FIG. 7. All the shunt resonators and series resonators are XBARs. The inclusion of four series and three shunt resonators is exemplary. A filter may have more or fewer than seven total resonators, more or fewer than four series resonators, and more or fewer than three shunt resonators. Typically, all of the series resonators are connected in series between an input and an output of the filter. All of the shunt resonators are typically connected between ground and the input, the output, or a node between two series resonators.

In the exemplary filter 700, the series resonators 710A, B, C, D and the shunt resonators 720A, B, D of the filter 700 are formed on a single plate 730 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence.

Each of the resonators 710A, 710B, 710C, 710D, 720A, 720B, 720C in the filter 700 has a resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 700. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Description of Methods

Figure 8:
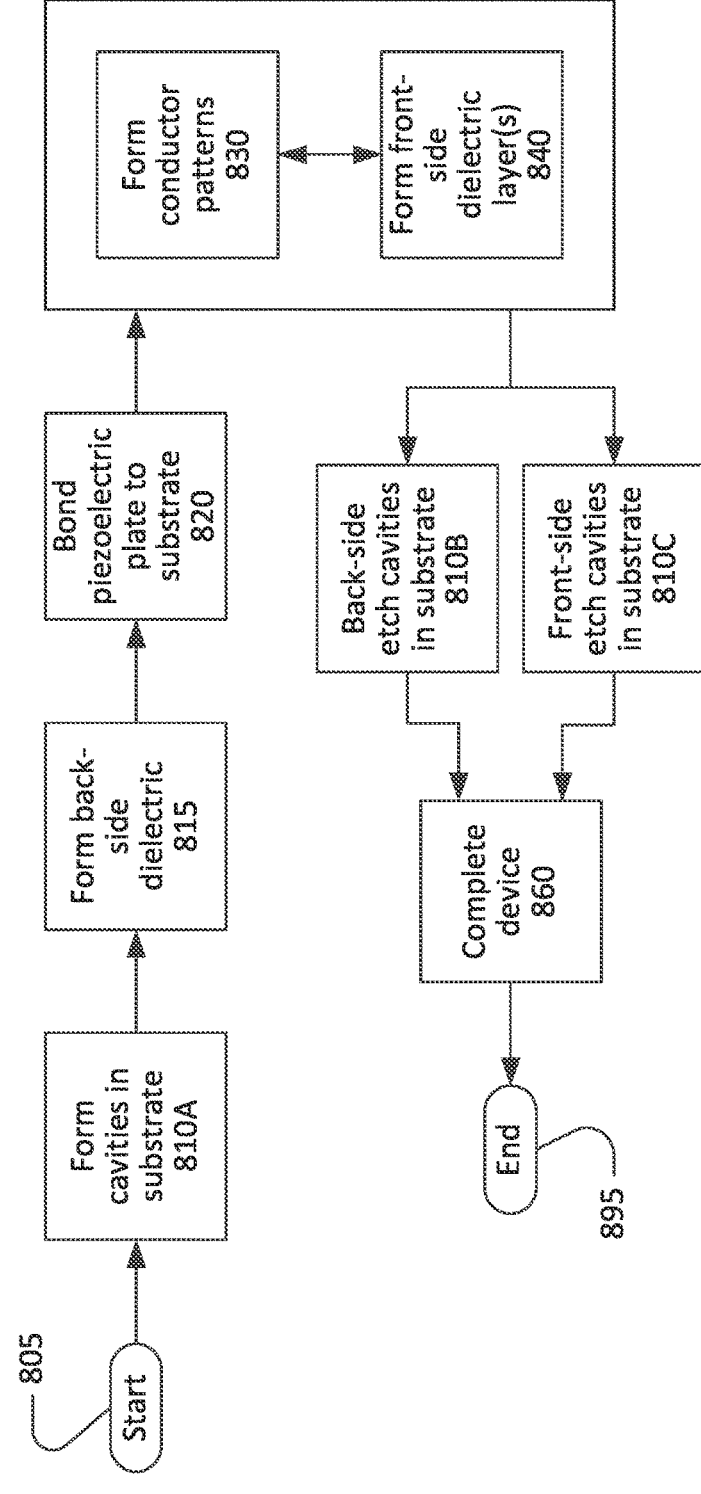
FIG. 8 is a flow chart of a method of fabricating an XBAR.

FIG. 8 is a simplified flow chart showing a process 800 for making an XBAR or a filter incorporating XBARs. The process 800 starts at 805 with a substrate and a plate of piezoelectric material and ends at 895 with a completed XBAR or filter. The flow chart of FIG. 8 includes only major process steps. Various conventional process steps (e.g. surface preparation, cleaning, inspection, baking, annealing, monitoring, testing, etc.) may be performed before, between, after, and during the steps shown in FIG. 8.

The flow chart of FIG. 8 captures three variations of the process 800 for making an XBAR which differ in when and how cavities are formed in the substrate. The cavities may be formed at steps 810A, 810B, or 810C. Only one of these steps is performed in each of the three variations of the process 800.

The piezoelectric plate may be lithium niobate or lithium tantalate. The piezoelectric plate may be Z-cut, rotated Z-cut, or rotated YX-cut, or some other cut. The substrate may preferably be silicon. The substrate may be some other material that allows formation of deep cavities by etching or other processing.

In one variation of the process 800, one or more cavities are formed in the substrate at 810A, before the piezoelectric plate is bonded to the substrate at 820. The cavity may be formed at 810A before or after the back-side dielectric layer is formed at 815. A separate cavity may be formed for each resonator in a filter device. The one or more cavities may be formed using conventional photolithographic and etching techniques. Typically, the cavities formed at 810A will not penetrate through the substrate, and the resulting resonator devices will have a cross-section as shown in FIG. 3.

At 815, the back-side dielectric layer may be formed by depositing silicon dioxide or another dielectric material on the back surface of the piezoelectric plate, the surface of the substrate, or both.

At 820, the piezoelectric plate is bonded to the substrate such that the back-side dielectric layer is sandwiched between the substrate and the piezoelectric plate. The piezoelectric plate and the substrate may be bonded by a wafer bonding process. Typically, the mating surfaces of the substrate and the piezoelectric plate are highly polished. An intermediate material, which may be the back-side dielectric layer, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 830 by depositing and patterning one or more conductor layer on the front-side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

At 840, a front-side dielectric layer may be formed by depositing one or more layers of dielectric material on the front-side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of a frequency setting dielectric layer on different portions of the piezoelectric plate corresponding to different shunt resonators.

The actions at 830 and 840 may be performed in either order or may be performed as a single integrated sequence of process steps. For example, the front-side dielectric layer may be deposited over the front surface of the piezoelectric plate. The front-side dielectric layer may then be coated with photoresist. The photoresist may then be exposed through a mask to define the areas where the IDT fingers and other conductors will be formed. The front-side dielectric layer may then be etched to remove the dielectric material from the areas where the IDT fingers and other conductors will be formed. The conductor metal can then be deposited to cover the remaining photoresist and fill the areas where the front-side dielectric layer was removed. The photoresist can then be stripped, lifting off the excess conductor metal and leaving the IDT fingers in the grooves previously etched in the front-side dielectric layer. The conductor pattern and the front-side dielectric layer may be formed using some other sequence of process steps.

In a second variation of the process 800, one or more cavities are formed in the back-side of the substrate at 810B. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 800, one or more cavities in the form of recesses in the substrate may be formed at 810C by etching the substrate using an etchant introduced through openings in the piezoelectric plate. A separate cavity may be formed for each resonator in a filter device. The one or more cavities formed at 810C will not penetrate through the substrate, and the resulting resonator devices will have a cross-section as shown in FIG. 3.

In all variations of the process 800, the filter device is completed at 860. Actions that may occur at 860 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 860 is to tune the resonant frequencies of the resonators within the device by adding or removing metal or dielectric material from the front-side of the device. This tuning may also include selectively removing material from shunt resonators to create multiple frequency setting dielectric layer thicknesses. After the filter device is completed, the process ends at 895.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. An acoustic resonator comprising:
a substrate;
a piezoelectric layer attached directly or via one or more intermediate layers to the substrate and having a portion that forms a diaphragm over a cavity;
an interdigital transducer (IDT) at a surface of the piezoelectric layer, the IDT including:
a first conductor level including first and second busbars disposed on respective portions of the piezoelectric layer,
a first set of elongated fingers extending from the first busbar onto the diaphragm, and
a second set of elongated fingers extending from the second busbar onto the diaphragm, the second set of elongated fingers interleaved with the first set of elongated fingers; and
a second conductor level covering at least portions of the first and second busbars,
wherein the second conductor level has a thickness that is greater than a thickness of the first conductor level.

2. The acoustic resonator of claim 1, wherein the IDT is configured such that a radio frequency signal applied between the first and second busbars excites a primary shear acoustic mode in the diaphragm.

3. The acoustic resonator of claim 1, further comprising:
a first set of dummy fingers extending from the first busbar onto the diaphragm, each finger of the first set of dummy fingers aligned with a corresponding finger of the second set of elongated fingers; and
a second set of dummy fingers extending from the second busbar onto the diaphragm, each finger of the second set of dummy fingers aligned with a corresponding finger of the first set of elongated fingers.

4. The acoustic resonator of claim 1, wherein an edge of at least one of the first and second busbars is offset from an edge of the cavity in a direction substantially parallel to the surface of the piezoelectric layer.

5. The acoustic resonator of claim 4, wherein the second conductor level covers substantially all of the at least one of the first and second busbars.

6. The acoustic resonator of claim 1, wherein the piezoelectric layer is one of lithium niobate and lithium tantalate, and the piezoelectric layer comprises a crystallographic orientation that is one of a Z-cut, a rotated Z-cut, and a rotated YX-cut.

7. The acoustic resonator of claim 1, wherein the first and second busbars are not on the diaphragm.

8. An acoustic resonator comprising:
a substrate;
a piezoelectric layer attached directly or via one or more intermediate layers to the substrate and having a portion that forms a diaphragm over a cavity;
a first conductor level at a surface of the piezoelectric layer, the first conductor level including:
first and second busbars;
a first set of elongated fingers extending from the first busbar onto the diaphragm,
a second set of elongated fingers extending from the second busbar onto the diaphragm, the second set of elongated fingers interleaved with the first set of elongated fingers; and
a second conductor level covering at least portions of the first and second busbars,
wherein the piezoelectric layer and the first and second sets of elongated fingers are configured such that a radio frequency signal applied between the first and second busbars excites a primary shear acoustic mode in the diaphragm.

9. The acoustic resonator of claim 8, wherein the first and second busbars are not on the diaphragm.

10. The acoustic resonator of claim 8, wherein the piezoelectric layer is one of lithium niobate and lithium tantalate, and the piezoelectric layer comprises a crystallographic orientation that is one of a Z-cut, a rotated Z-cut, and a rotated YX-cut.

11. The acoustic resonator of claim 8, further comprising:
a first set of dummy fingers extending from the first busbar onto the diaphragm, each finger of the first set of dummy fingers aligned with a corresponding finger of the second set of elongated fingers; and
a second set of dummy fingers extending from the second busbar onto the diaphragm, each finger of the second set of dummy fingers aligned with a corresponding finger of the first set of elongated fingers.

12. The acoustic resonator of claim 8, wherein an edge of at least one of the first and second busbars is offset from an edge of the cavity in a direction substantially parallel to the surface of the piezoelectric layer.

13. The acoustic resonator of claim 12, wherein the second conductor level covers substantially all of the at least one of the first and second busbars.

14. The acoustic resonator of claim 8, wherein the second conductor level has a thickness that is greater than a thickness of the first conductor level.

15. A filter device comprising:
a plurality of acoustic resonators, with at least one resonator of the plurality of acoustic resonators comprising:
a substrate;
a piezoelectric layer attached directly or via one or more intermediate layers to the substrate and having a portion that forms a diaphragm over a cavity;
a first conductor level at a surface of the piezoelectric layer, the first conductor level including:
first and second busbars;
a first set of elongated fingers extending from the first busbar onto the diaphragm,
a second set of elongated fingers extending from the second busbar onto the diaphragm, the second set of elongated fingers interleaved with the first set of elongated fingers; and
a second conductor level covering at least portions of the first and second busbars, wherein, for the at least one acoustic resonator, the second conductor level has a thickness that is greater than a thickness of the first conductor level.

16. The filter device of claim 15, wherein, for the at least one acoustic resonator, the piezoelectric layer and the first and second sets of elongated fingers are configured such that a radio frequency signal applied between the first and second busbars excites a primary shear acoustic mode in the diaphragm.

17. The filter device of claim 15, wherein, for the at least one acoustic resonator, an edge of at least one of the first and second busbars is offset from an edge of the cavity in a direction substantially parallel to the surface of the piezoelectric layer.

18. The filter device of claim 17, wherein, for the at least one acoustic resonator, the second conductor level covers substantially all of the at least one of the first and second busbars.

* * * * *